(12) United States Patent
Ou Yang

(10) Patent No.: US 12,062,547 B2
(45) Date of Patent: Aug. 13, 2024

(54) METHOD OF FABRICATING SEMICONDUCTOR DEVICE AND PATTERNING SEMICONDUCTOR STRUCTURE

(71) Applicant: NANYA TECHNOLOGY CORPORATION, New Taipei (TW)

(72) Inventor: Hsing Ou Yang, Tainan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 376 days.

(21) Appl. No.: 17/447,070

(22) Filed: Sep. 8, 2021

(65) Prior Publication Data
US 2023/0077092 A1 Mar. 9, 2023

(51) Int. Cl.
H01L 21/311 (2006.01)
H01L 21/027 (2006.01)

(52) U.S. Cl.
CPC .... H01L 21/31144 (2013.01); H01L 21/0276 (2013.01); H01L 21/31116 (2013.01)

(58) Field of Classification Search
CPC .......... H01L 21/31144; H01L 21/0276; H01L 21/31116
USPC ...................................................... 438/703
See application file for complete search history.

(56) References Cited

U.S. PATENT DOCUMENTS

| | | | |
|---|---|---|---|
| 5,801,099 A * | 9/1998 | Kim | H01L 21/76807 438/666 |
| 5,920,793 A * | 7/1999 | Mizushima | H01L 21/76802 438/669 |
| 6,174,804 B1 * | 1/2001 | Hsu | H01L 21/76807 438/653 |
| 2002/0164544 A1 | 11/2002 | Luckanc et al. | |
| 2006/0286792 A1 | 12/2006 | Chung et al. | |
| 2008/0102625 A1 * | 5/2008 | Eckert | H01L 21/76802 438/643 |
| 2010/0075503 A1 * | 3/2010 | Bencher | H01L 21/3086 257/E21.249 |
| 2017/0190792 A1 * | 7/2017 | Greene | C12N 9/96 |

FOREIGN PATENT DOCUMENTS

| | | |
|---|---|---|
| CN | 1264172 A | 8/2000 |
| EP | 1030361 A1 | 8/2000 |
| TW | 201521155 A | 6/2015 |
| TW | 201523739 A | 6/2015 |
| TW | 201710795 A | 3/2017 |

* cited by examiner

Primary Examiner — Dzung Tran
(74) Attorney, Agent, or Firm — CKC & Partners Co., LLC (57) ABSTRACT

The disclosure provides a method of fabricating a semiconductor device, where the method includes the following operations. A semiconductor stack including a silicon-containing layer, an oxide deposited on a portion of the silicon-containing layer, an underlayer, and a resist layer is formed. The resist layer is patterned to form a first opening in the resist layer. The underlayer is etched to extend the first opening into the underlayer, where a top surface of the oxide is exposed by the first opening. The oxide and the underlayer are etched with a first etchant, where a ratio of etching rates of the oxide and the underlayer is about 1:1. The oxide and the silicon-containing layer are etched with a second etchant to form a second opening below the first opening, where an etching rate of the oxide is higher than that of the silicon-containing layer.

10 Claims, 5 Drawing Sheets

METHOD OF FABRICATING SEMICONDUCTOR DEVICE AND PATTERNING SEMICONDUCTOR STRUCTURE

BACKGROUND

Field of Invention

The present disclosure relates to the methods of fabricating a semiconductor device and patterning a semiconductor structure.

Description of Related Art

The semiconductor industry has experienced exponential growth. Technological advances in the materials and design have produced generations of devices, where each generation has smaller and more complex circuits than the previous generation. The scaling down process generally provides benefits by increasing production efficiency and lowering associated costs. As the semiconductor fabrication processes desire smaller process windows, the spacing desired between elements of a device decreases and becomes more and more difficult to achieve. Therefore, lithography tools and patterning methods have been developed to meet the scaled down processes, which drives the formation of features of the desired critical dimension (CD). While the lithography equipment and patterning advances have been suitable in many respects, further advancements are desirable.

SUMMARY

The disclosure provides a method of fabricating a semiconductor device, where the method includes forming a semiconductor stack including a silicon-containing layer, an oxide deposited on a portion of the silicon-containing layer, an underlayer covering the oxide and the silicon-containing layer, and a resist layer over the underlayer. The method also includes patterning the resist layer to form a first opening in the resist layer and etching the underlayer to extend the first opening into the underlayer, where a top surface of the oxide is exposed by the first opening. The method also includes etching the oxide and the underlayer with a first etchant, where a ratio of a first etching rate of the oxide and a second etching rate of the underlayer is about 1:1. The method also includes etching the oxide and the silicon-containing layer with a second etchant different from the first etchant to form a second opening below the first opening, where a third etching rate of the oxide is higher than a fourth etching rate of the silicon-containing layer.

In some embodiments, a ratio of the third etching rate of the oxide and the fourth etching rate of the silicon-containing layer is about 3:1.

In some embodiments, after etching the underlayer to extend the first opening, a width of the first opening in the underlayer is larger than a maximum width of the oxide.

In some embodiments, after etching the oxide and the silicon-containing layer, a width of the first opening in the underlayer is larger than a width of the second opening in the underlayer.

In some embodiments, after etching the underlayer to extend the first opening, a first height between the top surface of the oxide and a bottom surface of the first opening is 25% to 35% of a second height between the top surface and a bottom surface of the oxide.

In some embodiments, the first etchant comprises a mixture of $CHF_3$ and $O_2$.

In some embodiments, the second etchant comprises a mixture of $CHF_3$ and $CH_2F_2$.

In some embodiments, the semiconductor stack further includes a BARC layer disposed between the underlayer and the resist layer, and etching the underlayer to extend the first opening further includes etching the BARC layer.

In some embodiments, the method further includes extending the second opening through the silicon-containing layer to separate the semiconductor device into two portions.

In some embodiments, the method further includes extending the second opening through the silicon-containing layer and filling the second opening with an insulating material to form an insulator.

The disclosure provides a method of patterning a semiconductor structure. The method includes patterning a first resist layer to form a first opening in the first resist layer and patterning a second resist layer under the first resist layer to extend the first opening into the second resist layer, where a top surface of an oxide in the second resist layer is higher than a bottom surface of the first opening. The method also includes etching the oxide and the second resist layer with a first etchant, where a first etching rate of the oxide is close to a second etching rate of the second resist layer. The method also includes etching the oxide and a silicon-containing layer under the oxide with a second etchant to form a second opening below the first opening, where a third etching rate of the oxide is higher than a fourth etching rate of the silicon-containing layer.

In some embodiments, after patterning the second resist layer, a width of the bottom surface of the first opening is larger than a maximum width of the oxide.

In some embodiments, after etching the oxide and the silicon-containing layer, a width of the bottom surface of the first opening is larger than a width of the second opening in the silicon-containing layer.

In some embodiments, after etching the oxide and the silicon-containing layer, a width of the second opening in the silicon-containing layer is close to a maximum width of the oxide.

In some embodiments, after etching the oxide and the silicon-containing layer, the bottom surface of the first opening is higher than an interface between the second resist layer and the silicon-containing layer.

In some embodiments, after etching the oxide and the silicon-containing layer, a depth of a first portion of the second opening in the second resist layer is larger than a depth of a second portion of the second opening in the silicon-containing layer.

In some embodiments, etching the oxide and the silicon-containing layer further includes etching a portion of the second resist layer adjacent to the oxide to form a sidewall of the second opening perpendicular to an interface between the second resist layer and the silicon-containing layer.

In some embodiments, a ratio of the third etching rate of the oxide and the fourth etching rate of the silicon-containing layer is between 2.5:1 and 3.5:1.

In some embodiments, patterning the second resist layer includes etching the second resist layer with an oxygen-based etchant.

In some embodiments, the first etchant includes a fluorine-comprising gas and an oxygen-comprising gas, and the second etchant includes the fluorine-comprising gas.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows. Aspects of the present disclosure are best understood from the following detailed description when read with the accompanying figures. It is noted that, in accordance with the standard practice in the industry, various features are not drawn to scale.

FIGS. 2A to 6 are cross-sectional views of the semiconductor device in intermediate stages of the fabricating process according to some embodiments of the present disclosure.

DETAILED DESCRIPTION

The following disclosure provides many different embodiments, or examples, for implementing different features of the provided subject matter. Specific examples of components, values, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a method of fabricating a semiconductor device by patterning the semiconductor structure. The method includes forming a semiconductor stack with at least one silicon-containing layer, an oxide deposited on the silicon-containing layer, and an underlayer covering the oxide and the silicon-containing layer. The oxide is then etched by a two-step etching process so that the oxide in the underlayer may be completely removed. In detail, the two-step process includes etching the oxide with a first etchant having low etching selectivity for the oxide and the underlayer; and etching the oxide with a second etchant having high etching selectivity for the oxide with respect to the silicon-containing layer. Therefore, the pattern in the underlayer is well defined while the over-etching of the silicon-containing layer may be avoided.

Figure 1:
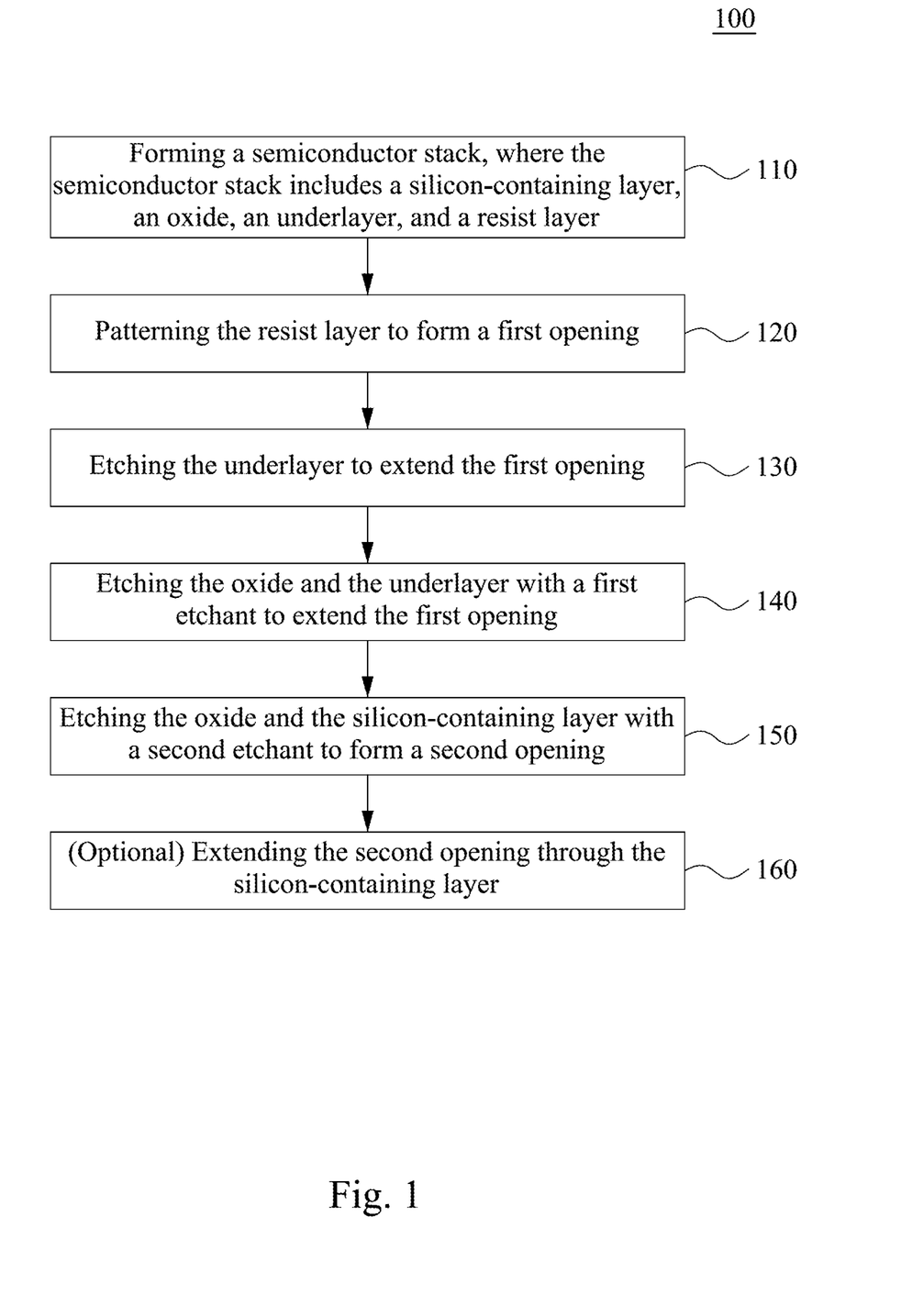
FIG. 1 is a flow diagram of a method of fabricating a semiconductor device according to some embodiments of the present disclosure.

According to some embodiments of the present disclosure, FIG. 1 illustrates a flow diagram of a method 100 of fabricating a semiconductor device. FIGS. 2A to 6 are cross-sectional views of the semiconductor device in intermediate stages of the fabricating method 100. The method 100 may be used to pattern a layer of a semiconductor device. The semiconductor device may include memory and/or other logic circuits, passive components, or active microelectronic devices, such as resistors, capacitors, inductors, diodes, p-type field effect transistors (PFET), n-type field effect transistors (NFET), metal oxide semiconductor field effect transistors (MOSFET), complementary metal oxide semiconductor (CMOS) transistors, high voltage transistors, high frequency transistors, other suitable components, or combinations thereof.

Specifically, the method 100 includes the following operations. In step 110, a semiconductor stack is formed, where the semiconductor stack includes a silicon-containing layer, an oxide, an underlayer, and a resist layer. In step 120, the resist layer is patterned to form a first opening. In step 130, the underlayer is etched to extend the first opening. In step 140, the oxide and the underlayer are etched with a first etchant to extend the first opening. In step 150, the oxide and the silicon-containing layer are etched with a second etchant to form a second opening. After the above-mentioned operations, the semiconductor device is fabricated as the semiconductor stack is patterned. In the following description, the method 100 of fabricating the semiconductor device is further described in details in conjunction with FIG. 2A to FIG. 6. It should be noted that additional operations may be performed before, during, or after the following operations, and these modifications are within the scope of the present disclosure.

Figure 2A:
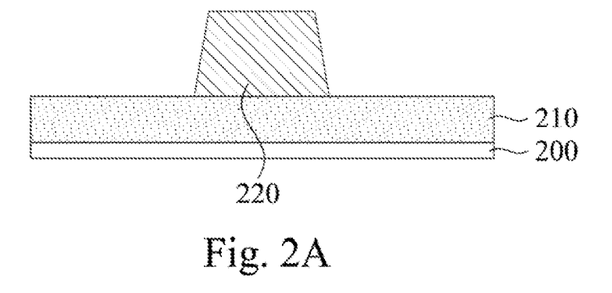
Figure 2B:
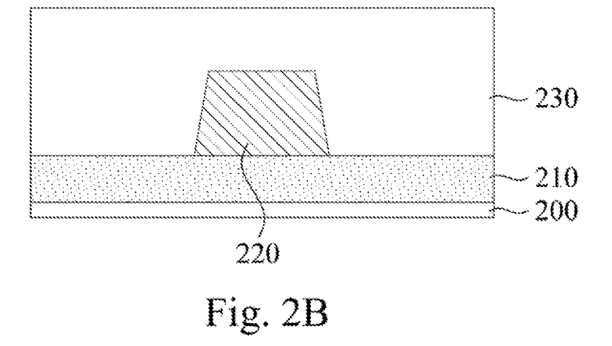
Figure 2C:
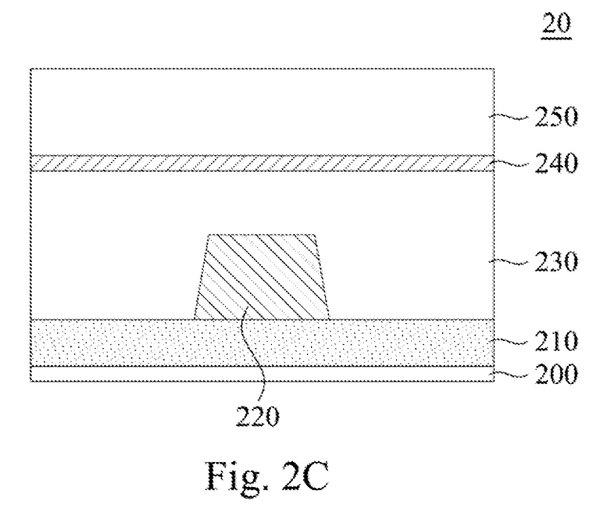

In step 110, a semiconductor stack is formed, as shown in FIGS. 2A to 2C. The semiconductor stack includes a target layer or multiple target layers to be patterned. More specifically, the semiconductor stack includes at least one silicon-containing layer, where the silicon-containing layer is referred as the target layer to be patterned. By patterning the target layer, the target layer may be configured into a plurality of features having openings. The pattern of the target layer may be directed to various semiconductor device features such as interconnect lines, isolation structures, active regions, or the like.

Referring to FIG. 2A, a silicon-containing layer 210 is formed on a substrate 200, and an oxide 220 is deposited on a portion of the silicon-containing layer 210. In some embodiments, the substrate 200 may include an elementary semiconductor, such as germanium, and/or germanium; a compound semiconductor, such as silicon carbide, gallium arsenide, gallium phosphide, indium phosphide, and/or indium arsenide; an alloy semiconductor, such as silicon germanium, gallium arsenide phosphide, aluminum gallium arsenide, aluminum indium arsenide, gallium indium arsenide, and/or gallium indium phosphide; or combinations thereof. In some other embodiments, the substrate 200 may be a silicon-on-insulator (SOI) substrate. Within or above the substrate 200, there may be various features (not shown) associated with the semiconductor devices, such as the gate structures, the source/drain regions, the isolation features, the interconnect features, or the like.

In some embodiments, the silicon-containing layer 210 may include a silicon-based material having a silicon composition greater than 50 atomic %. For example, the silicon-containing layer may be amorphous silicon (a-Si) layer. In some other embodiments, the silicon-containing layer 210 may include other components such as hydrogen, thus providing hydrogenated amorphous silicon. In some embodiments, the silicon-containing layer 210 may be formed by chemical vapor deposition (CVD) process such as plasma enhanced CVD (PECVD), high density plasma CVD (HDPCVD), low-pressure CVD (LPCVD), sub-atmospheric CVD (SACVD), or other suitable methods. In some other embodiments, the silicon-containing layer 210 may be formed by physical vapor deposition (PVD) such as plasma enhanced PVD, sputtering, electron beam, thermal evaporation, or other suitable methods. In some other embodiments, the silicon-containing layer 210 may be formed by atomic layer deposition (ALD) such as plasma enhanced ALD.

In some embodiments, the oxide 220 may have a uniform width so that the sidewall of the oxide 220 is perpendicular to a top surface of the silicon-containing layer 210. In some other embodiments, the width of the oxide 220 may vary along the direction perpendicular to the top surface of the silicon-containing layer 210. In other words, an angle smaller or larger than 90 degrees may exist between the sidewall of the oxide 220 and the top surface of the silicon-containing layer 210. For example, as shown in FIG. 2A, the cross-sectional view of the oxide 220 shows a trapezoid-shape, where a width of the bottom surface of the oxide 220 is larger than that of the top surface of the oxide 220. In some embodiments, the oxide 220 may include a suitable dielectric material. For example, the oxide 220 may include silicon oxide or carbon doped silicon oxide. In some other embodiments, the oxide 220 may include a dielectric material having a dielectric constant that is less than 3.9.

Referring to FIG. 2B, an underlayer 230 is formed on the oxide 220 and the silicon-containing layer 210. The underlayer 230 covers the oxide 220 and the silicon-containing layer 210 so that the underlayer 230 may act as a resist or mask in the following patterning process. Thus, the underlayer 230 may also be referred as the second resist layer (compared to the later formed first resist layer 250 in FIG. 2C). In some embodiments, the underlayer 230 may include patternable carbon-containing materials such as organic polymers. For example, the underlayer 230 may include polyimide. It should be noted that the underlayer 230 may include suitable patternable material that is not photosensitive. In some embodiments, the underlayer 230 may include materials different from that of the oxide 220 such that the underlayer 230 and the oxide 220 may be respectively etched in different etching process. For example, the oxide 220 may include silicon oxide while the underlayer 230 includes polyimide. In some embodiments, the underlayer 230 may be formed by chemical vapor deposition process, physical vapor deposition process, or other suitable methods. In some other embodiments, the underlayer 230 may be formed by spin-on coating.

Referring to FIG. 2C, a resist layer 250 is formed over the underlayer 230 to form the semiconductor stack 20. The resist layer 250 may include photosensitive materials so that the resist layer 250 on the top of the semiconductor stack 20 would be patterned first. The pattern of the resist layer 250 would then be transferred into the underlying underlayer 230. Therefore, the resist layer 250 may also be referred as the first resist layer. In some embodiments, the resist layer 250 may include a suitable photoresist material different from the underlayer 230. For example, the resist layer 250 may include epoxy resin while the underlayer 230 is a carbon layer. In some embodiments, a bottom antireflective coating (BARC) layer 240 may be formed on the underlayer 230 before the formation of the resist layer 250 in the semiconductor stack 20. The BARC layer 240 disposed between the underlayer 230 and the resist layer 250 may include an organic material selected for the photolithography process to be performed in step 120. More specifically, the BARC layer 240 may provide suitable anti-reflective properties depending on the wavelength of radiation exposing the resist layer 250. In some embodiments, the BARC layer 240 may be formed by spin-on coating.

As shown in FIG. 2C, the silicon-containing layer 210 in the semiconductor stack 20 is referred as the target layer to be patterned. However, the oxide 220 is deposited on the portion of the silicon-containing layer 210 which the opening of the pattern would be formed in the following process. If the oxide 220 on the silicon-containing layer 210 and the underlayer 230 above the oxide 220 are removed in one step, the oxide 220 may not be completely removed. As a result, the pattern of the silicon-containing layer 210 would be affected by the remained residue of the oxide 220, leading to the defect of the semiconductor device. For example, the etchant etching the silicon-containing layer 210 may be blocked by the remained oxide 220 so that the opening width in the silicon-containing layer 210 does not meet the desired critical dimension. Therefore, the following steps of the method 100 are provided to completely remove the oxide 220.

Figure 3:
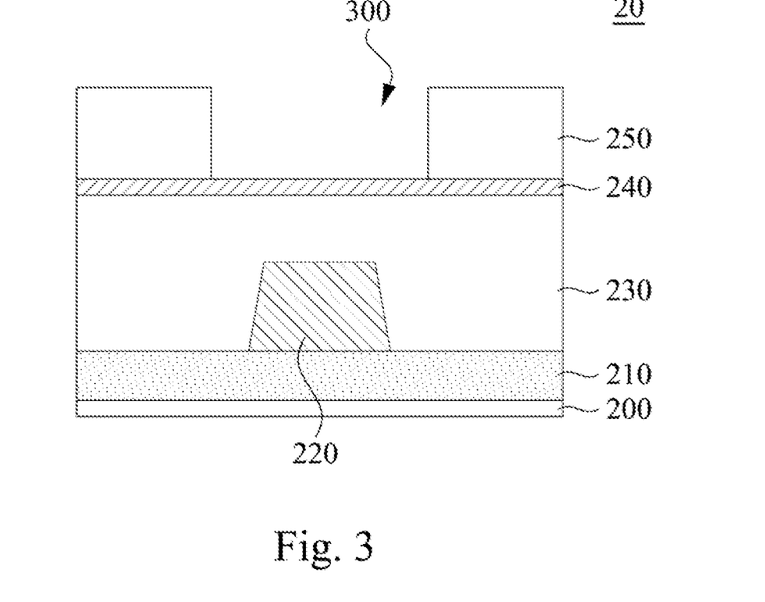

In step 120, the resist layer (or referred as the first resist layer) is patterned to form a first opening in the resist layer. Referring to FIG. 3, a first opening 300 is formed in the resist layer 250, and the BARC layer 240 under the resist layer 250 is exposed. The first opening 300 is formed above the oxide 220, as shown in FIG. 3. More specifically, the oxide 220 is positioned in the projection of the first opening 300 on the top surface of the silicon-containing layer 210. In some embodiments, the resist layer 250 may be patterned by exposing and developing certain portions of the resist layer 250 using the lithography process.

Figure 4:
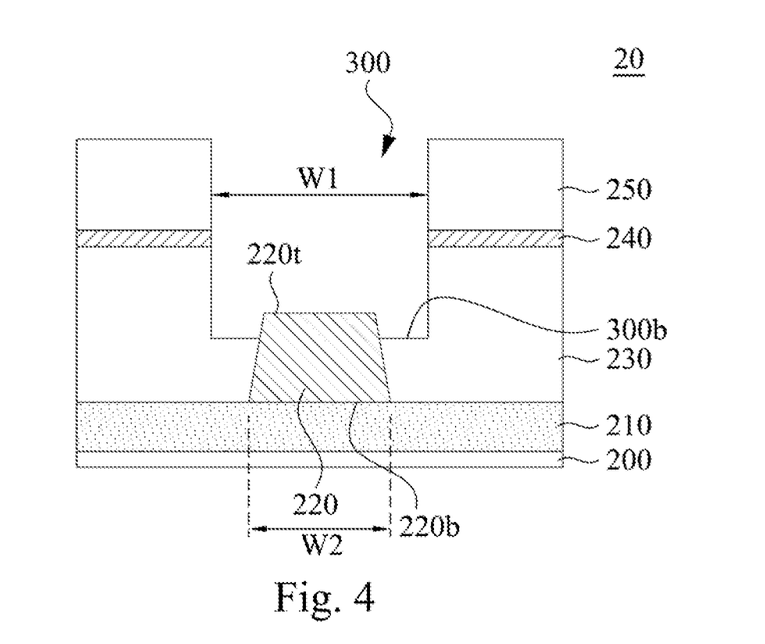

In step 130, the underlayer (or referred as the second resist layer) is patterned to extend the first opening into the underlayer. Referring to FIG. 4, the first opening 300 is extended into the underlayer 230 by etching the underlayer 230. Specifically, a top surface 220t of the oxide 220 is exposed by the first opening 300 extended into the underlayer 230. In other words, after step 130, the top surface 220t of the oxide 220 in the underlayer 230 is higher than a bottom surface 300b of the first opening 300. In some embodiments, after etching the underlayer 230 to extend the first opening 300, a first height between the top surface 220t of the oxide 220 and the bottom surface 300b of the first opening 300 may be smaller than a second height between the top surface 220t and a bottom surface 220b of the oxide 220. For example, the first height between the top surface 220t and the bottom surface 300b may be 25% to 35% of the second height between the top surface 220t and the bottom surface 220b.

In some embodiments, after etching the underlayer 230 to extend the first opening 300, a width W1 of the first opening 300 in the underlayer 230 may be larger than a maximum width W2 of the oxide 220. The first opening 300 with the width W1 larger than width W2 is preferable for completely removing the oxide 220 in the following process. For example, the bottom surface 220b of the oxide 220 may have the maximum width W2 as the oxide 220 has the trapezoid-shape shown in FIG. 4. After the first opening 300 is extended into the underlayer 230, the width W1 of the bottom surface 300b of the first opening 300 is larger than the maximum width W2 of the oxide 220. In some embodiments, patterning the underlayer 230 may include etching the underlayer 230 by dry etching process. For example, as the underlayer 230 includes a carbon-containing material, the underlayer 230 may be etched with an oxygen-based etchant such as $O_2$. In some embodiments which the semiconductor stack 20 includes the BARC layer 240 between the resist layer 250 and the underlayer 230, patterning the underlayer 230 to extend the first opening 300 may further include etching the BARC layer 240 simultaneously.

Figure 5:
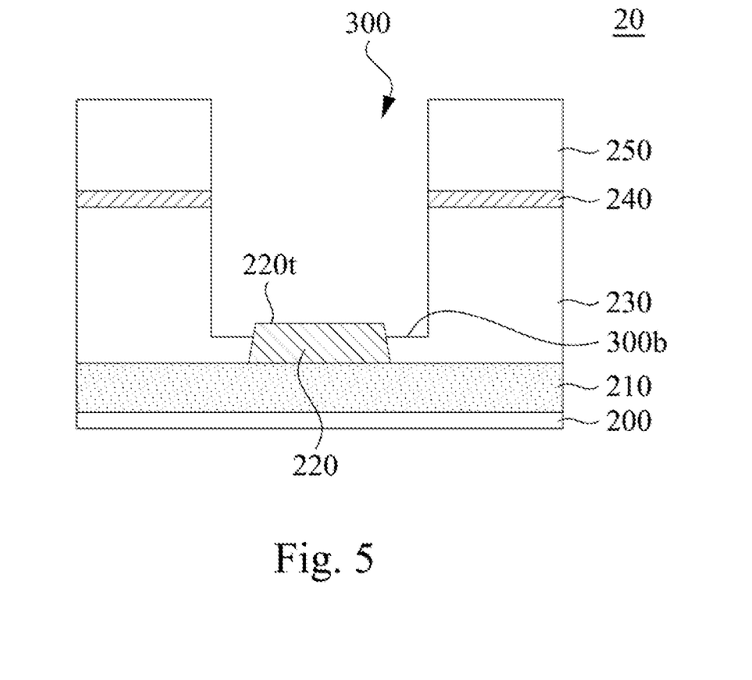

In step 140, the oxide and the underlayer are etched with a first etchant to extend the first opening. Referring to FIG. 5, the oxide 220 and the underlayer 230 are etched with a first etchant so that the bottom surface 300b of the first opening 300 is closer to the silicon-containing layer 210. Specifically, in the etching process using the first etchant, a first etching rate of the oxide 220 is close to a second etching rate of the underlayer 230. In other words, a ratio of the first etching rate of the oxide 220 and the second etching rate of the underlayer 230 is about 1:1. Therefore, the first opening 300 may be extended with a uniform width as the oxide 220 and the underlayer 230 are etched simultaneously. As shown in FIG. 5A, since the etching rate of the oxide 220 is close to that of the underlayer 230, the top surface 220t of the oxide 220 may be higher than the bottom surface 300b of the first opening 300 after step 140. In some embodiments, the first etching rate of the oxide 220 and the second etching rate of the underlayer 230 may be between 140 nm/min and 150 nm/min. In some embodiments, the first etchant of the dry etching process in step 140 may include suitable gas component so that the first etchant has low etch selectivity for the oxide 220 with respect to the underlayer 230. For example, the first etchant may include a mixture of fluorine-comprising gas and oxygen-comprising gas, such as a mixture of $CHF_3$ and $O_2$.

Figure 6:
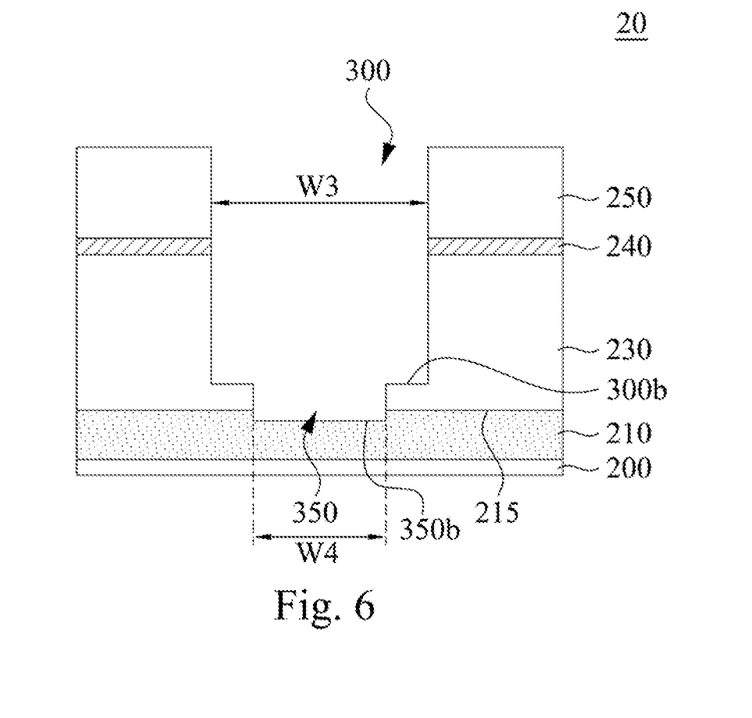

In step 150, the oxide and the silicon-containing layer are etched with a second etchant to form a second opening. Referring to FIG. 6, the oxide 220 and the silicon-containing layer 210 are etched with a second etchant different from the first etchant until the oxide 220 is removed. As a result, a second opening 350 is formed below the first opening 300, where the second opening 350 includes a first portion in the underlayer 230 and a second portion in the silicon-containing layer 210. Specifically, in the etching process using the second etchant, a third etching rate of the oxide 220 is higher than a fourth etching rate of the silicon-containing layer 210. Therefore, the oxide 220 may be completely removed while the over-etching of the silicon-containing layer 210 is avoided.

In some embodiments, a ratio of the third etching rate of the oxide 220 and the fourth etching rate of the silicon-containing layer 210 may be between 2.5:1 and 3.5:1. For example, the ratio of the third etching rate of the oxide 220 and the fourth etching rate of the silicon-containing layer 210 may be about 2.5:1, 2.8:1, 3:1, 3.2:1, or 3.5:1. In some embodiments, the third etching rate of the oxide 220 may be between 120 nm/min and 130 nm/min. In some embodiments, the fourth etching rate of the silicon-containing layer 210 may be between 40 nm/min and 45 nm/min. In some embodiments, the second etchant of the dry etching process in step 150 may include suitable gas component so that the second etchant has high etch selectivity for the oxide 220 with respect to the silicon-containing layer 210. For example, the second etchant may include a mixture of fluorine-comprising gases, such as a mixture of $CHF_3$ and $CH_2F_2$. In some embodiments, etching the oxide 220 and the silicon-containing layer 210 with the second etchant may further include etching a portion of the underlayer 230 adjacent to the oxide 220. For example, while the oxide 220 has the trapezoid-shape shown in FIG. 5, the second etchant may also etch portions of the underlayer 230 adjacent to the oxide 220 to form a sidewall of the second opening 350 perpendicular to an interface 215 between the underlayer 230 and the silicon-containing layer 210.

After removing the oxide 220 and etching the silicon-containing layer 210 in step 150, the structure of the semiconductor stack 20 is patterned as shown in FIG. 6. In some embodiments, a width of the second opening 350 in the silicon-containing layer 210 may be close to a maximum width of the oxide 220. Referring to FIG. 4 and FIG. 6, the oxide 220 is completely removed to form the second opening 350. As a result, the width W4 of the bottom surface 350b of the second opening 350 may be the same as the width W2 of the bottom surface 220b of the oxide 220. In some embodiments, a width of the first opening 300 in the underlayer 230 may be larger than a width of the second opening 350 in the underlayer 230 or the silicon-containing layer 210. For example, since the width W1 of the first opening 300 is larger than the width W2 of the oxide 220 shown in FIG. 4, the width W3 of the bottom surface 300b of the first opening 300 may be larger than the width W4 of the bottom surface 350b of the second opening 350 in the silicon-containing layer 210. In some embodiments, the etching process using the second etchant may have higher etching selectivity for the oxide 220 with respect to the silicon-containing layer 210. As a result, a depth of the first portion of the second opening 350 in the underlayer 230 may be larger than a depth of the second portion of the second opening 350 in the silicon-containing layer 210. In some embodiments, the etching process using the second etchant may have higher etching selectivity for the oxide 220 with respect to the underlayer 230. As a result, the bottom surface 300b of the first opening 300 may be higher than the interface 215 between the underlayer 230 and the silicon-containing layer 210.

Figure 7A:
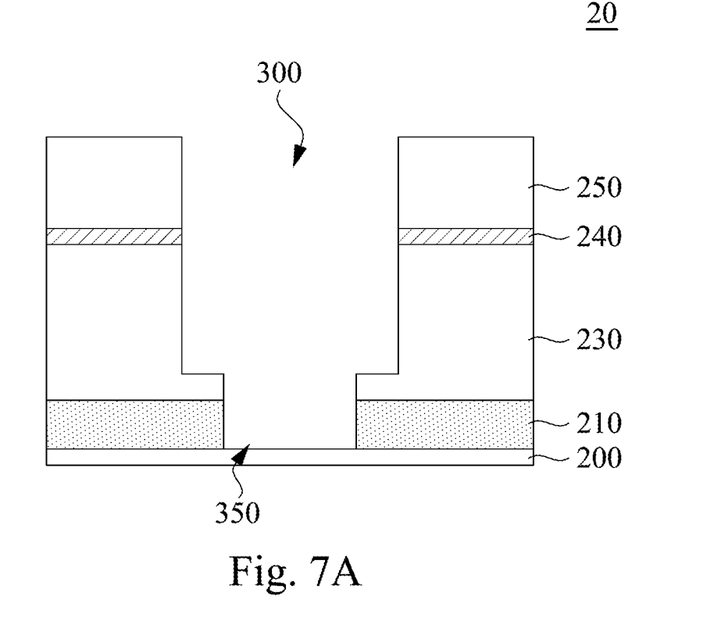
FIGS. 7A to 7B are cross-sectional views of the semiconductor device in intermediate stages of the fabricating process according to some other embodiments of the present disclosure.
Figure 7B:
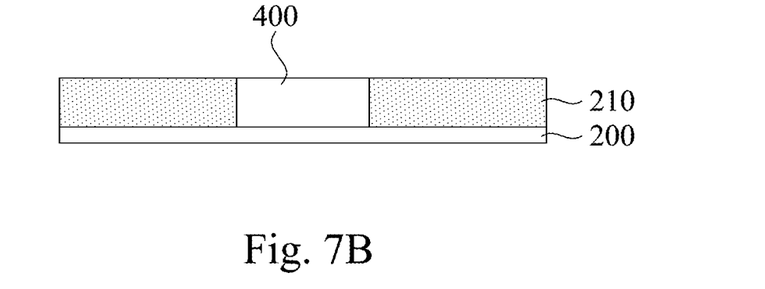

According to some other embodiments of the present disclosure, the method 100 may optionally include step 160. In step 160, the second opening is extended through the silicon-containing layer. FIGS. 7A to 7B are cross-sectional views of the semiconductor device in intermediate stages of the fabricating method 100. Referring to FIG. 7A, the second opening 350 is extended through the silicon-containing layer 210 so that the substrate 200 is exposed. Therefore, the semiconductor stack 20 is separated into two portions which may be fabricated into different components of the semiconductor device. In some embodiments, the resist layer 250 and the BARC layer 240 may be removed while extending the second opening 350 in step 160. In some embodiments, after extending the second opening 350 through the silicon-containing layer 210, the second opening 350 may be filled with suitable materials to form an element between the two portions of the silicon-containing layer 210. For example, the second opening 350 extended through the silicon-containing layer may be filled with an insulating material so that an insulator 400 is formed between the two portions of the silicon-containing layer 210, as shown in FIG. 7B. In some other embodiments, the second opening 350 extended through the silicon-containing layer may be filled with conductive materials to form conductive features. In some embodiments, the underlayer 230 may be removed before filling the second opening 350.

The method of fabricating the semiconductor device disclosed in the present disclosure provides the two-step etching process to pattern the target layer in the semiconductor structure. The oxide on the target layer is first etched with a first etchant, where the etching rate of the oxide is close to that of the underlayer on the oxide. Afterwards, the oxide is etched with a second etchant, where the etching rate of the oxide is higher than that of the silicon-containing layer, referred as the target layer, under the oxide. Through the two-step etching process, the oxide on the silicon-containing layer may be completely removed before patterning the silicon-containing layer, thereby forming the opening with the desired width in the underlayer. Therefore, the silicon-containing layer patterned with the underlayer may meet the critical dimension designed for the semiconductor device.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating a semiconductor device, comprising:
    forming a semiconductor stack comprising:
        a silicon-containing layer;
        an oxide deposited on a portion of the silicon-containing layer;
        an underlayer covering the oxide and the silicon-containing layer; and
        a resist layer over the underlayer;
    patterning the resist layer to form a first opening in the resist layer;
    etching the underlayer to extend the first opening into the underlayer, wherein a top surface of the oxide is exposed by the first opening;
    simultaneously etching the oxide and the underlayer by performing a first etching process using a first etchant, wherein a ratio of a first etching rate of the oxide and a second etching rate of the underlayer is about 1:1; and
    removing the oxide and etching the silicon-containing layer by performing a second etching process using a second etchant different from the first etchant to form a second opening below the first opening, wherein a third etching rate of the oxide is higher than a fourth etching rate of the silicon-containing layer.

2. The method of claim 1, wherein a ratio of the third etching rate of the oxide and the fourth etching rate of the silicon-containing layer is about 3:1.

3. The method of claim 1, wherein after etching the underlayer to extend the first opening, a width of the first opening in the underlayer is larger than a maximum width of the oxide.

4. The method of claim 1, wherein after etching the oxide and the silicon-containing layer, a width of the first opening in the underlayer is larger than a width of the second opening in the underlayer.

5. The method of claim 1, wherein after etching the underlayer to extend the first opening, a first height between the top surface of the oxide and a bottom surface of the first opening is 25% to 35% of a second height between the top surface and a bottom surface of the oxide.

6. The method of claim 1, wherein the first etchant comprises a mixture of $CHF_3$ and $O_2$.

7. The method of claim 1, wherein the second etchant comprises a mixture of $CHF_3$ and $CH_2F_2$.

8. The method of claim 1, wherein the semiconductor stack further comprises a BARC layer disposed between the underlayer and the resist layer, and etching the underlayer to extend the first opening further comprises etching the BARC layer.

9. The method of claim 1, further comprising:
    extending the second opening through the silicon-containing layer to separate the semiconductor device into two portions.

10. The method of claim 1, further comprising:
    extending the second opening through the silicon-containing layer; and
    filling the second opening with an insulating material to form an insulator.

* * * * *